US011257863B2

United States Patent
Song et al.

(10) Patent No.: US 11,257,863 B2
(45) Date of Patent: Feb. 22, 2022

(54) DEVICE AND METHOD FOR DISTURBANCE FREE 3D MRAM FABRICATION

(71) Applicants: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

(72) Inventors: Yibin Song, Shanghai (CN); Zhuofan Chen, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/898,189

(22) Filed: Feb. 15, 2018

(65) Prior Publication Data

US 2018/0286917 A1   Oct. 4, 2018

(30) Foreign Application Priority Data

Mar. 28, 2017   (CN) .......................... 201710190486.3

(51) Int. Cl.
*H01L 27/22* (2006.01)
*H01L 43/02* (2006.01)
(Continued)

(52) U.S. Cl.
CPC ............ *H01L 27/228* (2013.01); *H01L 43/02* (2013.01); *H01L 43/08* (2013.01); *H01L 43/12* (2013.01)

(58) Field of Classification Search
CPC ... G11C 11/16; G11C 11/161; G11C 11/1659; H01L 43/08; H01L 43/12; H01L 27/228; H01L 43/02; H01L 27/222
See application file for complete search history.

(56) References Cited

U.S. PATENT DOCUMENTS 6,469,926 B1 * 10/2002 Chen ...................... B82Y 25/00
                                                           360/324.11
6,639,830 B1 * 10/2003 Heide ................... G11C 11/161
                                                              365/158
(Continued)

FOREIGN PATENT DOCUMENTS

CN   106505146        3/2017
JP   2007-43043    *  2/2007   ......... H01L 21/8246
(Continued)

OTHER PUBLICATIONS

Chinese Application No. 201110190486.3, Office Action dated Mar. 19, 2020, 6 pages.

*Primary Examiner* — Mary A Wilczewski
(74) *Attorney, Agent, or Firm* — Anova Law Group, PLLC

(57) ABSTRACT

A magnetic random access memory includes a memory cell including a first fixed layer, a second fixed layer, and one or more free layers disposed between the first fixed layer and the second fixed layer. The first and second fixed layers are continuous layers and commonly shared by a plurality of memory cells. The magnetic random access memory has a relatively simple structure that not only reduces magnetic
(Continued)

interference between memory cells, but also simplifies the fabrication process and increases the integration level.

11 Claims, 9 Drawing Sheets

(51) Int. Cl.
*H01L 43/08* (2006.01)
*H01L 43/12* (2006.01)

(56) References Cited

U.S. PATENT DOCUMENTS

| | | | | |
|---|---|---|---|---|
| 6,714,444 B2* | 3/2004 | Huai | ............... | B82Y 25/00 365/158 |
| 7,120,049 B2* | 10/2006 | Nakamura | ............... | G11C 11/15 365/171 |
| 7,266,012 B2* | 9/2007 | Saito | ............... | G11C 11/16 365/158 |
| 7,366,010 B2* | 4/2008 | Hosobuchi | ............... | G11C 11/16 257/421 |
| 8,040,724 B2* | 10/2011 | Suzuki | ............... | B82Y 10/00 365/145 |
| 8,058,696 B2* | 11/2011 | Ranjan | ............... | B82Y 10/00 257/421 |
| 8,194,443 B2* | 6/2012 | Yamane | ............... | B82Y 25/00 365/148 |
| 8,865,481 B2* | 10/2014 | Li | ............... | H01L 43/08 257/421 |
| 9,025,371 B1* | 5/2015 | Huai | ............... | H01L 43/02 365/171 |
| 9,412,935 B1* | 8/2016 | Lin | ............... | H01L 43/12 |
| 9,525,126 B1* | 12/2016 | Lin | ............... | H01L 43/12 |
| 9,721,990 B2* | 8/2017 | Lin | ............... | H01L 43/02 |
| 10,319,424 B1* | 6/2019 | Kim | ............... | G11C 11/165 |
| 10,529,915 B2* | 1/2020 | Araki | ............... | G11C 11/1675 |
| 2003/0062981 A1* | 4/2003 | Hosomi | ............... | B82Y 10/00 336/200 |
| 2003/0103393 A1* | 6/2003 | Asao | ............... | B82Y 10/00 365/200 |
| 2003/0169147 A1* | 9/2003 | Higo | ............... | G11C 11/161 338/32 R |
| 2003/0214837 A1* | 11/2003 | Smith | ............... | G11C 11/1673 365/173 |
| 2004/0001372 A1* | 1/2004 | Higo | ............... | B82Y 25/00 365/200 |
| 2004/0165425 A1* | 8/2004 | Nakamura | ............... | G11C 11/15 365/171 |
| 2004/0240123 A1* | 12/2004 | Amano | ............... | B82Y 10/00 360/324.2 |
| 2006/0060901 A1* | 3/2006 | Nakamura | ............... | G11C 11/16 257/295 |
| 2007/0228501 A1* | 10/2007 | Nakamura | ............... | H01L 27/228 257/421 |
| 2007/0285974 A1* | 12/2007 | Takemura | ............... | G11C 8/08 365/158 |
| 2008/0062578 A1* | 3/2008 | Watanabe | ............... | G11C 11/16 360/324.1 |
| 2008/0094886 A1* | 4/2008 | Ranjan | ............... | B82Y 10/00 365/171 |
| 2009/0218645 A1* | 9/2009 | Ranjan | ............... | G11C 11/16 257/421 |
| 2010/0110777 A1* | 5/2010 | Katou | ............... | H01L 43/08 365/158 |
| 2010/0321993 A1* | 12/2010 | Nikonov | ............... | B82Y 25/00 365/171 |
| 2011/0103143 A1* | 5/2011 | Ranjan | ............... | H01L 27/222 365/171 |
| 2011/0147816 A1* | 6/2011 | Nikonov | ............... | B82Y 25/00 257/295 |
| 2012/0069648 A1* | 3/2012 | Kramer | ............... | H01L 27/228 365/171 |
| 2012/0135275 A1* | 5/2012 | Kariyada | ............... | G11C 11/161 428/828.1 |
| 2012/0154063 A1* | 6/2012 | Nikonov | ............... | H01L 43/08 331/94.1 |
| 2013/0113058 A1* | 5/2013 | Fukami | ............... | H01L 43/08 257/421 |
| 2013/0175645 A1* | 7/2013 | Sugibayashi | ............ | B82Y 25/00 257/421 |
| 2013/0187247 A1* | 7/2013 | Wu | ............... | G11C 11/161 257/421 |
| 2013/0201757 A1* | 8/2013 | Li | ............... | G11C 11/1673 365/171 |
| 2013/0258764 A1* | 10/2013 | Ranjan | ............... | G11C 11/16 365/158 |
| 2014/0070344 A1* | 3/2014 | Khalili Amiri | ........ | H01L 27/226 257/421 |
| 2015/0207063 A1* | 7/2015 | Tanigawa | ............ | G11C 11/1675 257/421 |
| 2015/0332748 A1* | 11/2015 | Wang | ............... | G11C 11/165 365/158 |
| 2016/0027842 A1* | 1/2016 | Khalili Amiri | ...... | G11C 11/1659 257/421 |
| 2016/0056205 A1* | 2/2016 | Nakamura | ........... | G11C 11/1659 257/252 |
| 2016/0190436 A1* | 6/2016 | Hu | ............... | G11C 11/161 438/3 |
| 2016/0247550 A1* | 8/2016 | Fukami | ............... | H01L 43/08 |
| 2016/0379698 A1* | 12/2016 | Saida | ............... | H01F 10/3286 365/158 |
| 2017/0069685 A1* | 3/2017 | Lin | ............... | H01L 43/12 |
| 2017/0179373 A1* | 6/2017 | Swerts | ............... | H01L 43/08 |
| 2018/0061467 A1* | 3/2018 | Kan | ............... | G11C 11/161 |
| 2018/0090194 A1* | 3/2018 | Silva | ............... | G11C 11/161 |
| 2018/0108390 A1* | 4/2018 | Fukami | ............... | H01L 43/08 |
| 2018/0286917 A1* | 10/2018 | Song | ............... | H01L 27/228 |
| 2019/0214554 A1* | 7/2019 | Li | ............... | G11C 11/161 |
| 2020/0098409 A1* | 3/2020 | Li | ............... | H01L 27/228 |

FOREIGN PATENT DOCUMENTS

| | | | | |
|---|---|---|---|---|
| JP | 2009-81390 | * | 4/2009 | ......... H01L 21/8246 |
| WO | WO 2009/078244 | * | 6/2009 | ......... H01L 21/8246 |
| WO | WO 2011/093363 | * | 4/2011 | ......... H01L 21/8246 |

* cited by examiner

DEVICE AND METHOD FOR DISTURBANCE FREE 3D MRAM FABRICATION

CROSS-REFERENCES TO RELATED APPLICATIONS

This application claims priority to Chinese patent application No. 201710190486.3, filed with the State Intellectual Property Office of People's Republic of China on Mar. 28, 2017, the content of which is incorporated herein by reference in its entirety.

FIELD OF THE INVENTION

The present invention relates generally to semiconductor technology. More particularly, embodiments of the present invention relate to a magnetic random access memory cell, a random access memory including the memory cell, and a manufacturing method thereof.

BACKGROUND OF THE INVENTION

Magnetic random access memory (MRAM) refers to a random access memory that stores data based on magnetoresistive properties. It uses the different magnetic resistances due to the different magnetization directions to store "0" and "1" bits. As long as the external magnetic field does not change, the magnetization direction also does not change. With the increase in technical requirements, three-dimensional MRAM devices have gained more attention. A memory cell of an MRAM device includes a fixed layer and a free layer separated from each other by an insulator layer. The free layer of the memory cell is connected to a bit line, and the fixed layer is connected to a word line. When the magnetic field direction of the free layer is parallel to the magnetic field direction of the fixed layer, the memory cell is in a low resistance state and can store "0" data. When the magnetic field direction of the free layer is in the opposite magnetic field direction of the fixed layer, the memory cell is in a high resistance state and can store "1" data.

At present, the fixed layer, the free layer, and the insulator layer of memory cells of an MRAM device are separated from each other. Each memory cell has its own separate fixed layer, free layer, and insulator layer. When the integration level of memory cells in an MRAM is high, the process of connecting the fixed layer and the free layer becomes relatively more difficult, which affects the integration level of the MRAM. Further, with the high integration level of memory cells in an MRAM, and a voltage applied between the free layer and the fixed layer, the current flowing therethrough will cause magnetic field interference of the fixed layer and the free layer of neighboring memory cells, thereby adversely affecting the MRAM reliability.

SUMMARY OF THE INVENTION

Embodiments of the present invention provide a magnetic memory cell, a magnetic random access memory with improved reliability and higher level of integration, and a method for manufacturing thereof.

In one aspect of the present invention, a magnetic random access memory includes a memory cell including a first fixed layer, a second fixed layer, and one or more free layers disposed between the first fixed layer and the second fixed layer. The first and second fixed layers are commonly shared by a plurality of memory cells.

In one embodiment, the memory cell includes a first insulator layer disposed between the first fixed layer and the one or more free layers, and a second insulator layer disposed between the second fixed layer and the one or more free layers.

In one embodiment, the first insulator layer and second insulator layer are commonly shared by the plurality of memory cells.

In one embodiment, the one or more free layers include a plurality of free layers, each is associated with one of the plurality of memory cells, and the plurality of free layers are arranged along a direction extending parallel to the first insulator layer and the second insulator layer.

In one embodiment, the magnetic random access memory further includes a dielectric layer disposed between two adjacent free layers.

In one embodiment, the memory cell includes a first magnetic tunnel junction (MTJ) unit including a first MTJ and a first transistor; and a second MTJ unit including a second MTJ and a second transistor. The first MTJ and the second MTJ share the one or more free layers, the first MTJ is controlled by the first transistor, and the second MTJ is controlled by the second transistor. The first MTJ includes the first fixed layer, the first insulation layer, and the one or more free layers. The second MTJ includes the second fixed layer, the second insulation layer, and the one or more free layers.

In one embodiment, the magnetic random access memory also includes a word line connected to a gate of the first transistor and a gate of the second transistor, a first bit line connected to a source of the first transistor, a second bit line connected to a source of the second transistor, a drain the first transistor connected to the first fixed layer, a drain of the second transistor connected to the second fixed layer, and a select line connected to the one or more free layers and extending orthogonally to the word line, the first and second bit lines and from the memory cell. The select line is configured to connect to the first bit line through the source of the first transistor and the second bit line through the source of the second transistor, and transfer a voltage on the first bit line or on the second bit line to the one or more free layers.

In one embodiment, each of the one or more free layers changes its magnetic direction in response to the transferred voltage.

In one embodiment, the magnetic random access memory further includes a substrate disposed below the plurality of memory cells.

In one embodiment, the first fixed layer and second fixed layer are magnetic fixed layers, and the one or more free layers are magnetic free layers.

Embodiments of the present invention also provide a method for manufacturing a memory cell of a magnetic random access memory. The method includes providing a substrate structure including a substrate and a stacked structure having an alternating stack of a plurality of free layers and a plurality of first dielectric layers on the substrate. The method also includes etching the stacked structure to form a plurality of trenches extending to the substrate and dividing the stacked structure into a plurality of sublayer structures, forming an insulation layer on a surface of the sublayer structures and on bottoms and sidewalls of the trenches, forming a fixed layer on the insulation layer, and filling the plurality of trenches with a second dielectric layer.

In one embodiment, the method further includes, after forming the insulation layer and the fixed layer and prior to filling the trenches, removing a portion of the insulation layer and a portion of the fixed layer at the bottoms of the trenches using a portion of the fixed layer on the sidewalls of the trenches as a mask to expose a surface of the substrate and a portion of the insulation layer below the fixed layer.

In one embodiment, the method also includes removing the exposed portion of the insulation layer to form a recess below the fixed layer, and forming a material layer having a same material as a material of the fixed layer in the recess.

In one embodiment, the method further includes forming a second dielectric layer filling the trenches.

In one embodiment, the first fixed layer and second fixed layer are magnetic fixed layers, and the plurality of free layers are magnetic free layers.

In one embodiment, the method further includes forming a patterned hardmask layer on the stacked structure, and etching the stacked structure using the patterned hardmask layer as a mask to form the plurality of trenches.

A magnetic random access memory manufactured by the above-described method of the present invention includes a first fixed layer and a second fixed layer that are shared by a plurality of memory cells. The integration level can thus be increased and the electromagnetic interference between memory cells can be reduced.

The following description, together with the accompanying drawings, will provide a better understanding of the nature and advantages of the claimed invention.

BRIEF DESCRIPTION OF THE DRAWINGS

Embodiments of the present invention are described with reference to the accompanying drawings. In the drawings, like reference numbers may indicate identical or functionally similar elements.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention. For purposes of clarity, not every component may be labeled in every drawing.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Figure 1:
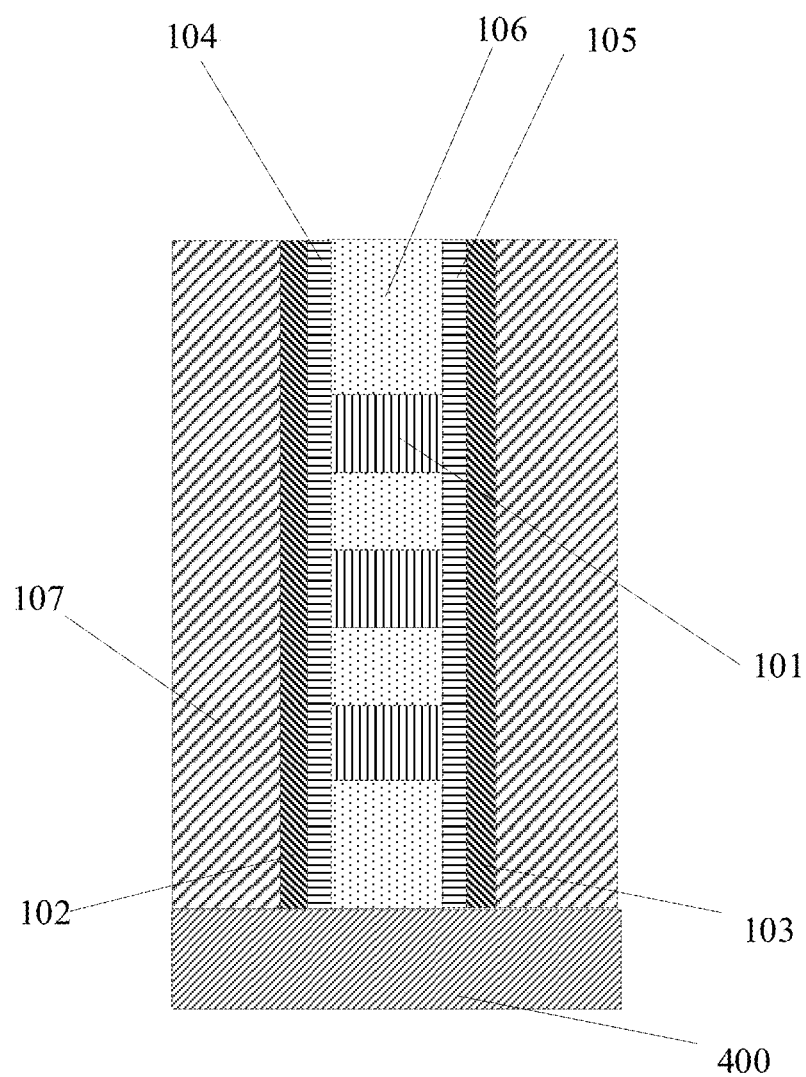
FIG. 1 is a cross-sectional view illustrating a memory cell of a three-dimensional MRAM device according to an embodiment of the present invention.

FIG. 1 is a cross-sectional view illustrating a memory cell of a three-dimensional magnetic random access memory (MRAM) according to an embodiment of the present invention.

Referring to FIG. 1, the magnetic random access memory includes one or more memory cells. Each memory cell includes a first fixed layer 102, a second fixed layer 103, and one or more free layers 101. The memory cells share first fixed layer 102 and second fixed layer 103. Free layers 101 of the memory cells are located between first fixed layer 102 and second fixed layer 103. Each of first fixed layer 102 and second fixed layer 103 is a continuous layer that is shared by the memory cells to simplify the structure of the three-dimensional magnetic random access memory.

A first insulator layer 104 is disposed between first fixed layer 102 and free layers 101, and a second insulator layer 105 is disposed between second fixed layer 103 and free layers 101. First insulator layer 104 and second insulator layer 105, which are commonly shared by the memory cells, include silicon oxide or the like. First insulator layer 104 and second insulator layer 105 common to the memory cells each are formed as continuous layers to simplify the structure of the three-dimensional magnetic random access memory.

Free layers 101 of the memory cells are arranged along a direction extending parallel to first insulator layer 104 and second insulator layer 105. A first dielectric layer 106 is disposed between free layers of adjacent memory cells and includes silicon oxide. The memory cells have an outer portion surrounded by a second dielectric layer 107 that may include silicon oxide.

First fixed layer 102 and second fixed layer 103 each may be a magnetic fixed layer, and free layers 101 each may be a magnetic free layer. In the exemplary embodiment, the memory cell includes two magnetic tunnel junctions (MTJ): a first MTJ including first fixed layer 102, first insulator layer 104, and one or more free layers 101; and a second MTJ including second fixed layer 103, second insulator layer 105, and one or more free layers 101. The memory cell includes two MTJ units: a first MTJ unit including the first MTJ and a first transistor M1; and a second MTJ unit including the second MTJ and a second transistor M2.

Figure 2A:
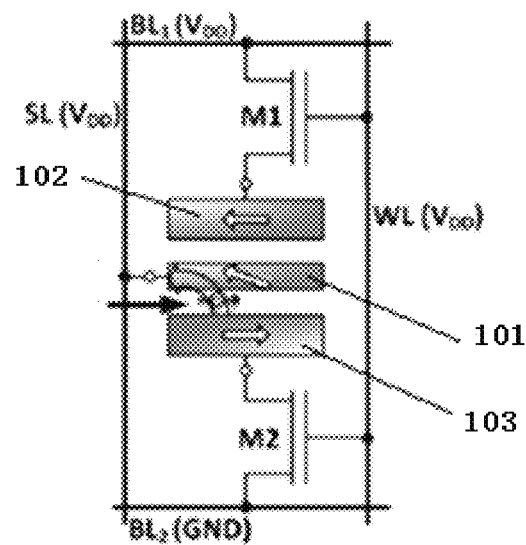
FIGS. 2A and 2B are schematic diagram of a connection between a magnetic tunnel junction (MTJ) and a transistor and a bit line and a word line.
Figure 2B:
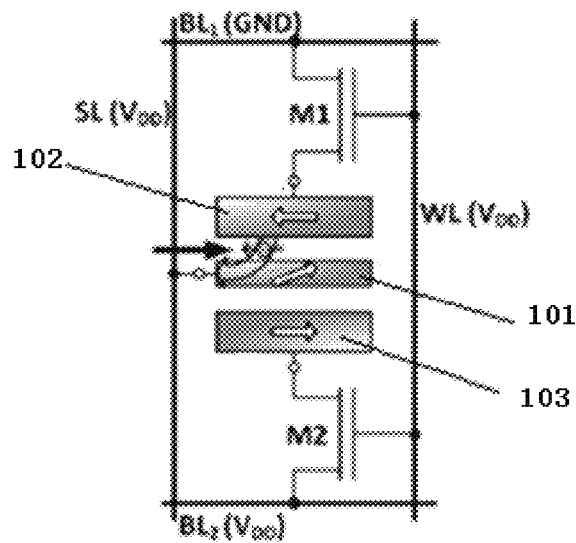

FIGS. 2A and 2B are conceptual views of respective write "0" and write "1" operations of the memory cell. Referring to FIGS. 2A and 2B, a gate of the first transistor M1 and a gate of the second transistor M2 are connected to a word line WL. The word line WL can be connected to a high voltage level $V_{DD}$. A drain of the first transistor M1 is connected to fixed layer 102, and a drain of the second transistor M2 is connected to second fixed layer 103.

A source of the first transistor M1 is connected to a first bit line $BL_1$, and a source of the second transistor M2 is connected to a second bit line $BL_2$. Each of the first bit line $BL_1$ and the second bit line $BL_2$ can be connected to the high voltage level $V_{DD}$ or to a ground potential (GND). The first bit line $BL_1$ and the second bit line $BL_2$ are connected through a select line SL. The select line SL is connected to a free layer 101 and extends orthogonally to the word line WL and the first and second bit lines $BL_1$ and $BL_2$ from the memory cell. For example, the bit lines $BL_1$ and $BL_2$ extend in the x-direction, the word line extends in the y-direction, and the select line extends in the z-direction. The bit lines, the word line and the select line do no intersect each other.

Referring to FIG. 2A, when performing a write operation, the word line WL is connected to the high voltage level $V_{DD}$, and the first transistor M1 and the second transistor M2 are turned on. The first bit line $BL_1$ is connected to the high voltage level $V_{DD}$, and the second bit line $BL_2$ is connected to ground GND. The high voltage level $V_{DD}$ on the first bit line $BL_1$ is then transferred to free layer 101 by the select line SL, so that electrons in second fixed layer 103 are moved (tunneled) to free layer 101 through the magnetic tunnel to complete a "0" data write operation. Note that the magnetic direction of free layer 101 is aligned (i.e., the same as) with the magnetic direction of first fixed layer 102 when the memory cell stores "0" data.

Referring to FIG. 2B, when performing a write operation, the word line WL is connected to the high voltage level $V_{DD}$, and the first transistor M1 and the second transistor M2 are turned on. The first bit line $BL_1$ is connected to GND, and the second bit line $BL_2$ is connected to the high voltage level $V_{DD}$. The high voltage level $V_{DD}$ on the second bit line $BL_2$ is then transferred to free layer 101 by the select line SL, so that electrons in first fixed layer 102 are tunneled to free layer 101 through the magnetic tunnel to complete a "1" data write operation. Note that the magnetic direction of free layer 101 is opposite to the magnetic direction of first fixed layer 102 when the memory cell stores "1" data.

In the magnetic random access memory of the above embodiment, the memory cells share common first fixed layer 102 and second fixed layer 103, it is only necessary to provide the first transistor M1, the second transistor M2, the first bit line $BL_1$ and the second bit lines $BL_2$ for the memory cells. For a plurality of memory cells, it can reduce the complexity of configuring the line connection process of the MRAM by setting up a select line SL to a corresponding free layer 101 of the memory cells, thereby improving the integration level of the MRAM, reducing the electromagnetic interference, and improving the MRAM performance.

Figure 3:
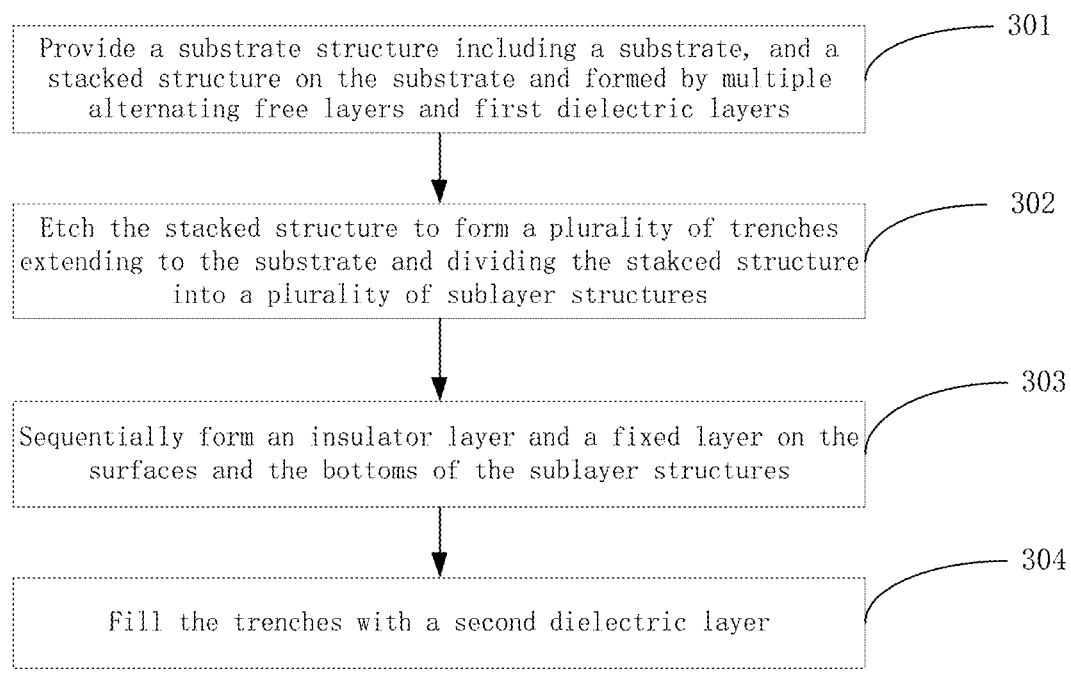
FIG. 3 is a simplified flowchart of a method for manufacturing a memory cell of a magnetic random access memory according to an embodiment of the present invention.

FIG. 3 is a simplified flowchart of a method for manufacturing a memory cell of a magnetic random access memory according to an embodiment of the present invention. FIGS. 4 to 9 are cross-sectional views illustrating intermediate stages of a magnetic random access memory in a manufacturing method according to an embodiment of the present invention. The manufacturing method of a memory cell of a magnetic random access memory according to one embodiment of the present invention will be described in detail with reference to FIG. 3 and FIGS. 4 to 9.

Referring to FIG. 3, at block S301, the method includes providing a substrate structure containing a substrate, and a stacked structure including an alternating stack of a plurality of free layers and a plurality of first dielectric layers on the substrate.

Figure 4:
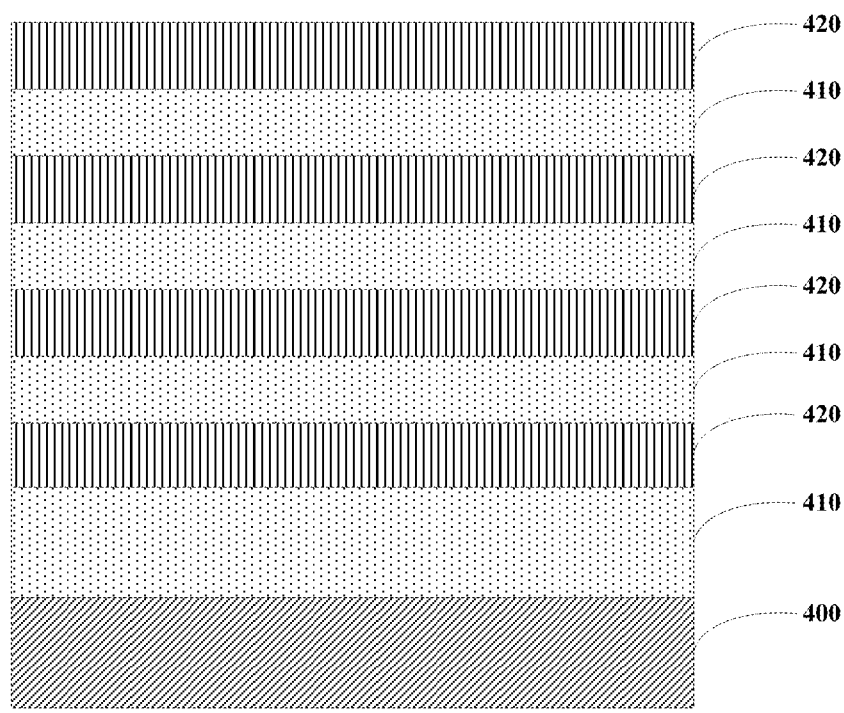
FIGS. 4 to 9 are cross-sectional views illustrating intermediate stages of a magnetic random access memory in a manufacturing method according to an embodiment of the present invention.

FIG. 4 is a cross-sectional view illustrating a structure in block S301 according to an embodiment of the present invention. Referring to FIG. 4, a substrate 400 is provided. Substrate 400 may be a silicon substrate or other types of substrate. In some embodiments, substrate 400 may be a semiconductor substrate including some other structures or layers, and the scope of the present invention is not limited thereto.

In one embodiment, block S301 may also include providing a plurality of free layers 420 and a plurality of first dielectric layers 410 that are alternately stacked on substrate 400, as shown in FIG. 4. Free layers 420 may be magnetic free layers. First dielectric layers 410 may include silicon oxide. In one embodiment, a first first dielectric layer 410 may be deposited on substrate 400, a first free layer 420 may be deposited on first first dielectric layer 410, then a second first dielectric layer 410 is deposited on first free layer 420, and so on, so that a plurality of first dielectric layers 410 and a plurality of free layers are alternatively formed on substrate 400.

Referring back to FIG. 3, at block S302, an etching process is performed on the stacked structure to form a plurality of trenches extending to the substrate. The trenches divide the stacked structure into a plurality of sublayer structures.

Figure 5:
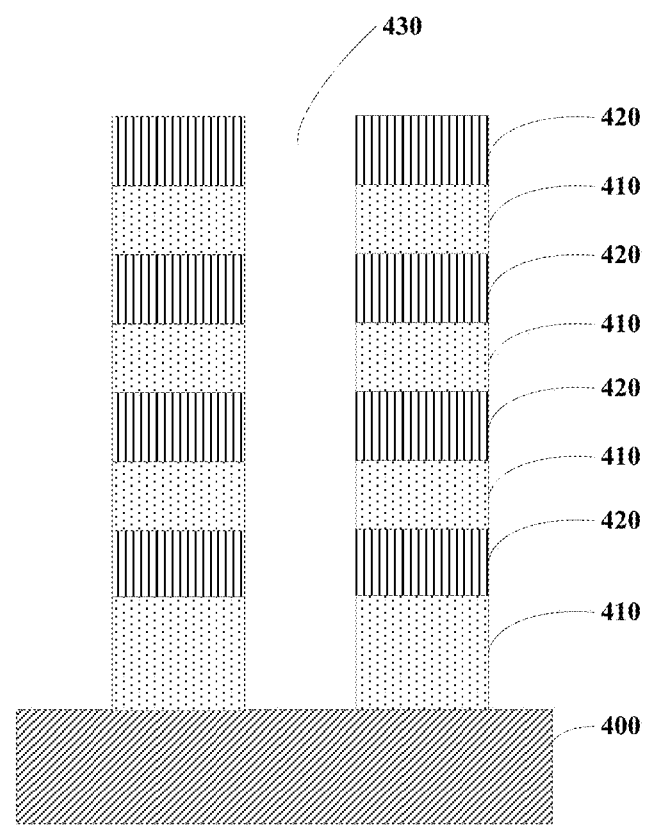

FIG. 5 is a cross-sectional view illustrating a structure in block S302 according to an embodiment of the present invention. Referring to FIG. 5, an etching process (e.g., photolithography and etching) is performed on the stacked structure of FIG. 4 to form a plurality of trenches 430 extending to substrate 400. Trenches 430 divide the stacked structure into a plurality of sublayer structures and expose an upper surface of substrate 400.

Referring back to FIG. 3, at block S303, an insulation layer is formed on the surface of the stacked structure and on the bottoms and sidewalls of the trenches. Thereafter, a fixed layer is formed on the insulator layer.

Figure 6:
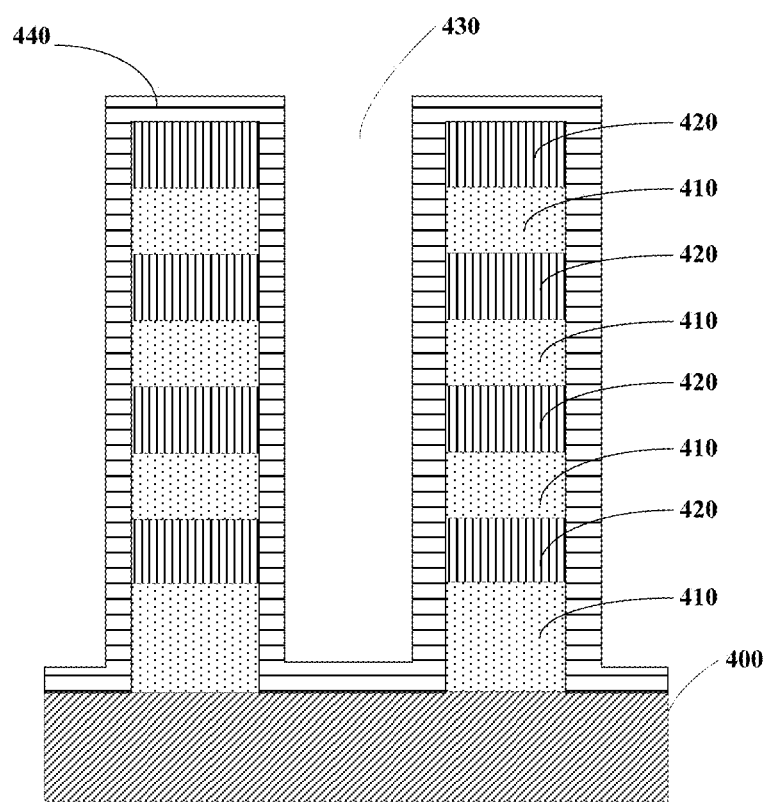
Figure 7:
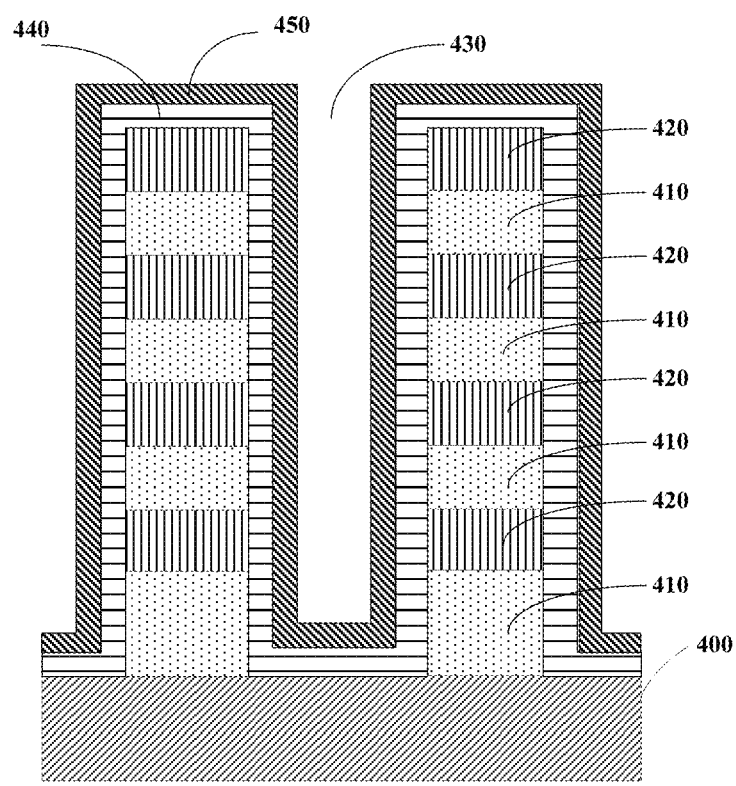

FIGS. 6 and 7 are cross-sectional views illustrating respective structures in block S303 according to an embodiment of the present invention. Referring to FIG. 6, an insulation layer 440 is deposited on the surface of the stacked structure and on the bottoms and sidewalls of trenches 430. Insulator layer 440 may include silicon oxide.

Referring to FIG. 7, a fixed layer 450 is deposited on insulator layer 440. In one embodiment, fixed layer 450 is deposited using an atomic layer deposition (ALD) process. Fixed layer 450 may include a magnetic fixed layer.

Referring back to FIG. 3, at block S304, a second dielectric layer is deposited on the fixed layer filling the trenches.

In one embodiment, after sequentially forming insulator layer 440 and fixed layer 450, and prior to forming the second dielectric layer filling trenches 430, the method further includes etching a portion of insulation layer 440 and a portion of fixed layer 450 at the bottoms of trenches 430. In one embodiment, an etching process is performed on the bottoms of the trenches using a portion of fixed layer 450 formed on sidewalls of trenches 430 as a mask to remove a portion of insulation layer 440 and a portion of fixed layer 450 at the bottoms of trenches 430 exposing a surface of the substrate.

Figure 8:
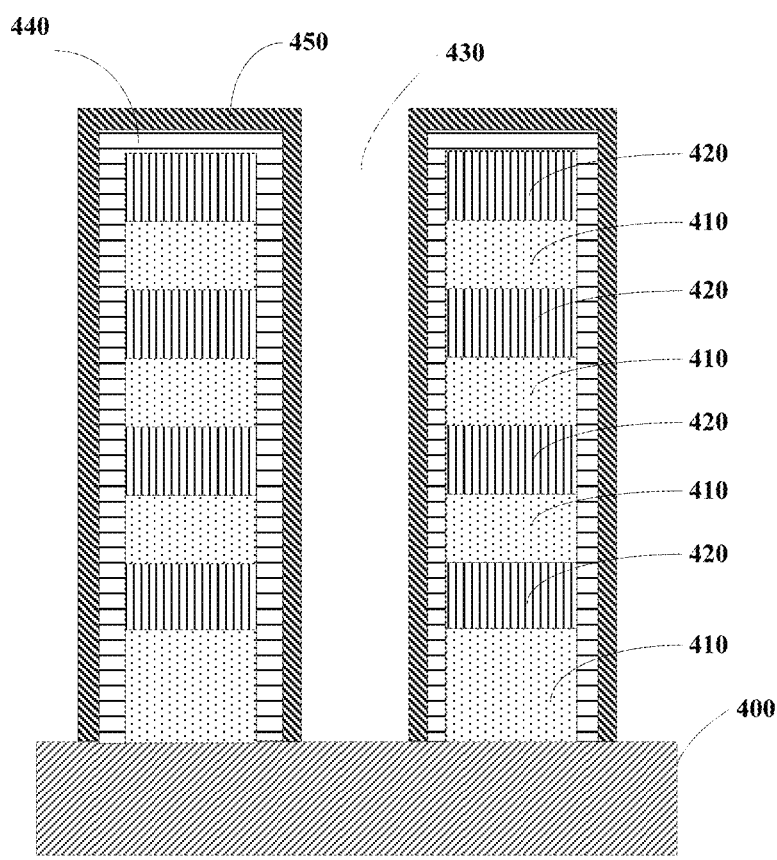

In one embodiment, after removing portions of insulator layer 440 and fixed layer 450 at the bottoms of trenches 430, the exposed portion of insulating layer 440 at the bottoms of trenches 430 below fixed layer 450 is removed using an etching process, and a material layer having a material the same as the material of fixed layer 450 is deposited in the original location of the removed portion of insulating layer 440 below fixed layer 450 to cover the exposed portion of insulating layer 440, so that the portion of insulating layer 440 at the bottoms of trenches 430 is not exposed. That is, insulating layer 440 on sidewalls of the trenches are completely covered by fixed layer 450 and the material layer having the same material as that of fixed layer 450, as shown in FIG. 8.

Figure 9:
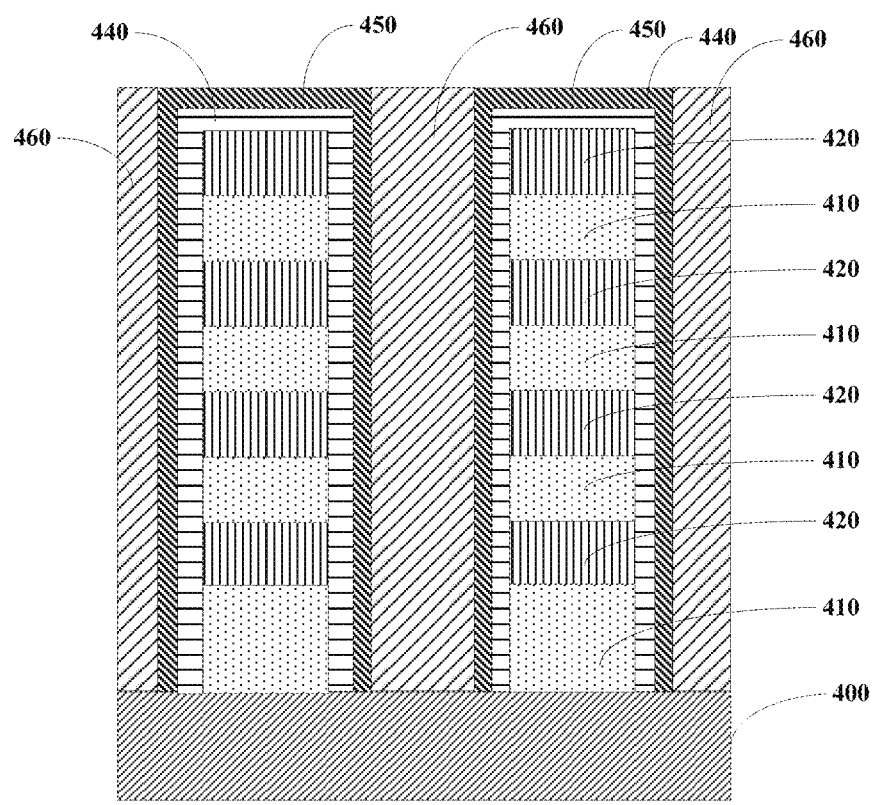

FIG. 9 is a cross-sectional view illustrating a structure in block S304 according to an embodiment of the present invention. Trenches 430 are filled with second dielectric layer 460 by a deposition process. Second dielectric layer 460 may include silicon oxide. In one embodiment, block S304 may also include planarizing second dielectric layer 460 so that the upper surface of the second dielectric layer is flush with the upper surface of fixed layer 450.

The above-described embodiments of the present invention provide a memory cell of a magnetic random access memory and a method for manufacturing thereof. By the above-described method, a first fixed layer and a second fixed layer common to a plurality of memory cells are formed to increase the integration level of the magnetic random access memory and reduce the electromagnetic interference of neighboring memory cells, so that the performance of the magnetic random access memory is improved.

In accordance with the present invention, the magnetic random access memory has a relative simple structure that can simplify the manufacturing process and increase the integration level of the magnetic random access memory. The magnetic random access memory according to embodiments of the present invention has an improved performance over the conventional the magnetic random access memory.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A magnetic random access memory, comprising:
   a memory cell including a first fixed layer, a second fixed layer, one or more free layers disposed between the first fixed layer and the second fixed layer, a first insulator layer disposed between the first fixed layer and the one or more free layers, a second insulator layer disposed between the second fixed layer and the one or more free layers, a first dielectric layer disposed between two adjacent free layers, a first transistor with a drain connected to the first fixed layer, a second transistor with a drain connected to the second fixed layer, and a second dielectric layer, the second dielectric layer having a first portion directly on the first fixed layer and a second portion directly on the second fixed layer,
   wherein the one or more free layers are directly sandwiched by the first insulator layer and the second insulator layer, and
   wherein the first fixed layers and the second fixed layers are parallel to each other.

2. The magnetic random access memory of claim 1, wherein the first insulator layer and the second insulator layer are continuous layers and commonly shared by the plurality of memory cells.

3. The magnetic random access memory of claim 2, wherein the memory cell comprises:
   a first magnetic tunnel junction (MTJ) unit including a first MTJ and the first transistor; and
   a second MTJ unit including a second MTJ and the second transistor;
   wherein the first MTJ and the second MTJ share the one or more free layers, the first MTJ is controlled by the first transistor, and the second MTJ is controlled by the second transistor;
   wherein the first MTJ comprises the first fixed layer, the first insulation layer, and the one or more free layers;
   wherein the second MTJ comprises the second fixed layer, the second insulation layer, and the one or more free layers.

4. The magnetic random access memory of claim 3, further comprising:
   a word line connected to a gate of the first transistor and a gate of the second transistor;
   a first bit line connected to a source of the first transistor;
   a second bit line connected to a source of the second transistor;
   a select line connected to the one or more free layers and extending orthogonally to the word line, the first and second bit lines and from the memory cell, the select line being configured to connect to the first bit line through the source of the first transistor and the second bit line through the source of the second transistor, and transfer a voltage on the first bit line or on the second bit line to the one or more free layers.

5. The magnetic random access memory of claim 4, wherein each of the one or more free layers changes its magnetic direction in response to the transferred voltage.

6. The magnetic random access memory of claim 1, wherein the one or more free layers comprise a plurality of free layers each associated with one of the plurality of memory cells, the plurality of free layers being arranged along a direction extending parallel to the first insulator layer and the second insulator layer.

7. The magnetic random access memory of claim 1, wherein the first and second fixed layer are magnetic fixed layers, and the one or more free layers are magnetic free layers.

8. The magnetic random access memory of claim 1, wherein the second dielectric layer surrounds the plurality of memory cells.

9. The magnetic random access memory of claim 1, wherein the second dielectric layer comprises silicon oxide.

10. The magnetic random access memory of claim 1, wherein the memory cell comprises two or more free layers.

11. The magnetic random access memory of claim 10, wherein the two or more free layers are arranged along a direction extending parallel to the first fixed layer and the second fixed layer.

\* \* \* \* \*